(12) United States Patent
Vincentsen et al.

(10) Patent No.: US 11,652,129 B1
(45) Date of Patent: *May 16, 2023

(54) COMPACT ANNULAR FIELD IMAGER OPTICAL INTERCONNECT

(71) Applicant: Wavefront Research, Inc., Northampton, PA (US)

(72) Inventors: David M. Vincentsen, Bethlehem, PA (US); Jonas D. Corl, Bethlehem, PA (US); Thomas A. Mitchell, Northampton, PA (US); Michelle M. Stone, Hellertown, PA (US); Thomas W. Stone, Hellertown, PA (US); Randall C. Veitch, Walnutport, PA (US)

(73) Assignee: Wavefront Research, Inc., Northhampton, PA (US)

( * ) Notice: Subject to any disclaimer, the term of this patent is extended or adjusted under 35 U.S.C. 154(b) by 24 days.

This patent is subject to a terminal disclaimer.

(21) Appl. No.: 17/353,695

(22) Filed: Jun. 21, 2021

Related U.S. Application Data

(63) Continuation of application No. 16/882,513, filed on May 24, 2020, now Pat. No. 11,043,526, which is a continuation of application No. 16/532,116, filed on Aug. 5, 2019, now Pat. No. 10,665,630, which is a continuation of application No. 14/213,014, filed on Mar. 14, 2014, now Pat. No. 10,373,998.

(60) Provisional application No. 61/792,886, filed on Mar. 15, 2013, provisional application No. 61/783,507, filed on Mar. 14, 2013.

(51) Int. Cl.
*H01L 27/146* (2006.01)

(52) U.S. Cl.
CPC .. *H01L 27/14636* (2013.01); *H01L 27/14618* (2013.01)

(58) Field of Classification Search
CPC ......... H01L 27/14636; H01L 27/14618; H01L 27/146; H01L 27/14601; H01L 27/14605; H01L 27/14607; H01L 27/14634; H01L 27/14625; H01L 27/14627
See application file for complete search history.

(56) References Cited

U.S. PATENT DOCUMENTS

| | | | | |
|---|---|---|---|---|
| 4,880,974 A * | 11/1989 | Yamakawa | .......... | G08B 13/193 257/E31.127 |
| 5,914,976 A * | 6/1999 | Jayaraman | ............ | H01S 5/0262 372/50.21 |
| 9,383,561 B1 * | 7/2016 | Mitchell | ............... | G02B 17/086 |
| 10,208,894 B1 * | 2/2019 | Mitchell | ............... | F25D 19/006 |
| 10,373,998 B1 * | 8/2019 | Vincentsen | ....... | H01L 27/14636 |
| 10,665,630 B1 * | 5/2020 | Vincentsen | ....... | H01L 27/14636 |

(Continued)

*Primary Examiner* — John R Lee

(74) *Attorney, Agent, or Firm* — Culhane Meadows PLLC; Orlando Lopez

(57) ABSTRACT

The present disclosure provides an optoelectronic module. In one aspect, the optoelectronic module includes an insertion member including a housing insert and an imager disposed in the housing insert, and a receiving member including an interposer, a housing disposed on the interposer, and an optoelectronic device electrically connected to said interposer. The housing of the receiving member is configured to engage and receive the housing insert of the insertion member. The optoelectronic device of the receiving member is configured to align with the imager of the insertion member.

12 Claims, 13 Drawing Sheets

(56) References Cited

U.S. PATENT DOCUMENTS

| | | | |
|---|---|---|---|
| 11,043,526 B1* | 6/2021 | Vincentsen | H01L 27/14636 |
| 2004/0033078 A1* | 2/2004 | Kube | H04B 10/1125 |
| | | | 398/130 |
| 2004/0233531 A1* | 11/2004 | Bratt | H04B 10/40 |
| | | | 359/558 |
| 2007/0206099 A1* | 9/2007 | Matsuo | G06V 40/10 |
| | | | 348/E5.029 |
| 2008/0198352 A1* | 8/2008 | Kugler | G02B 7/00 |
| | | | 359/850 |
| 2008/0266893 A1* | 10/2008 | Speier | F21S 2/005 |
| | | | 257/E25.02 |
| 2008/0317406 A1* | 12/2008 | Santori | H04B 10/803 |
| | | | 385/24 |
| 2009/0080881 A1* | 3/2009 | Yokoyama | H04J 14/0241 |
| | | | 398/16 |
| 2009/0179656 A1* | 7/2009 | Mueller | G02F 1/1309 |
| | | | 356/237.1 |
| 2010/0021176 A1* | 1/2010 | Holcombe | H04B 5/02 |
| | | | 398/115 |
| 2010/0260503 A1* | 10/2010 | Zhovnirovsky | H04B 10/803 |
| | | | 398/118 |
| 2011/0188054 A1* | 8/2011 | Petronius | G02B 26/10 |
| | | | 356/610 |
| 2011/0204233 A1* | 8/2011 | Costello | G01S 17/04 |
| | | | 250/338.4 |
| 2013/0037833 A1* | 2/2013 | Nam | H01L 33/647 |
| | | | 257/E33.056 |
| 2014/0241731 A1* | 8/2014 | Peach | H04B 10/11 |
| | | | 398/139 |

* cited by examiner

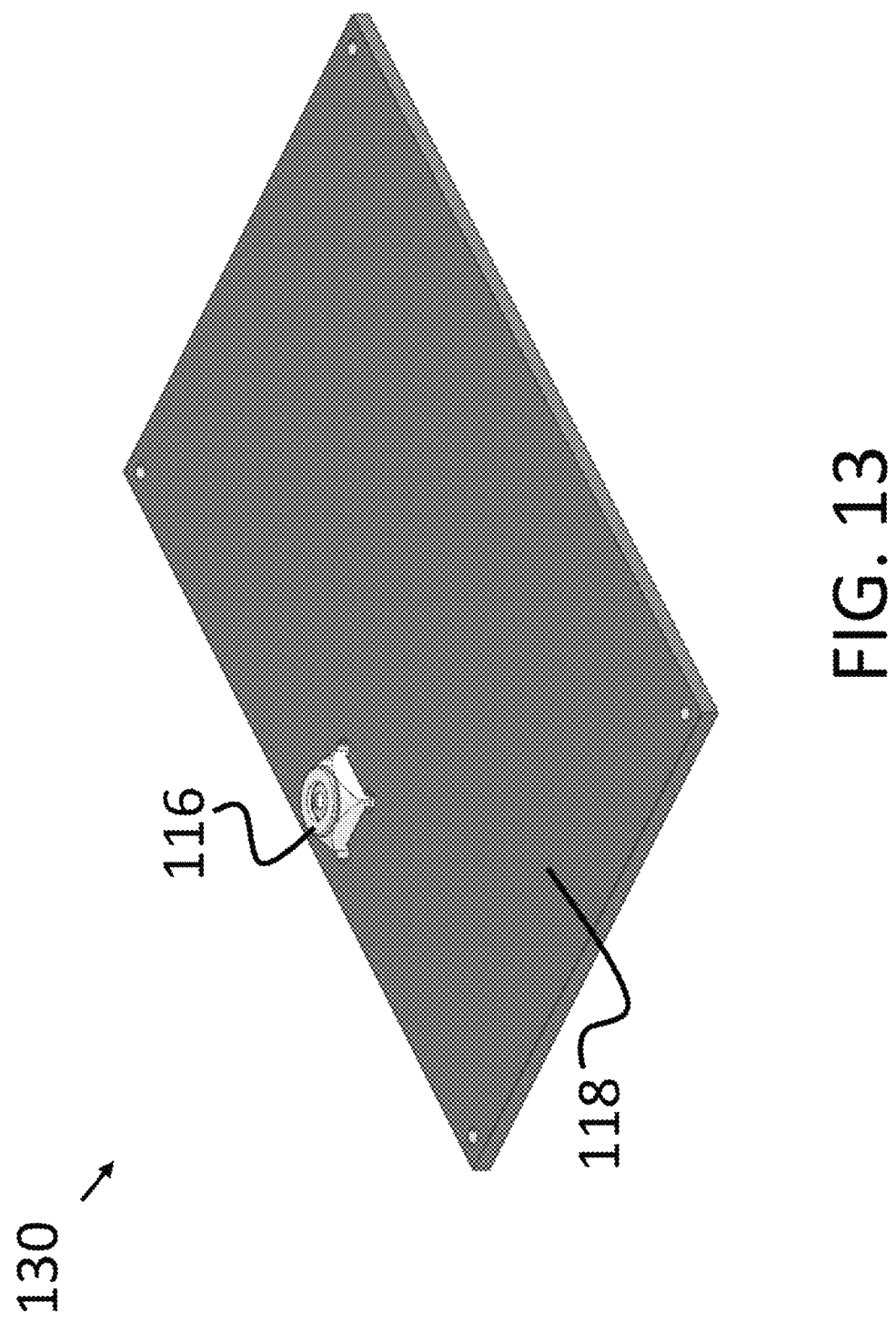

COMPACT ANNULAR FIELD IMAGER OPTICAL INTERCONNECT

CROSS-REFERENCE TO RELATED APPLICATIONS

This application is a continuation of U.S. application Ser. No. 16/882,513, entitled COMPACT ANNULAR FIELD IMAGER OPTICAL INTERCONNECT, filed on May 24, 2020, which is a continuation of U.S. application Ser. No. 16/532,116, filed on Aug. 5, 2019, entitled COMPACT ANNULAR FIELD IMAGER OPTICAL INTERCONNECT, which is a continuation of U.S. application Ser. No.: 14/213,014, filed on Mar. 14, 2014, entitled LOW PROFILE OPTICAL INTERCONNECT, now U.S. Pat. No. 10,373,998, issued on Aug. 6, 2019, which claims priority to U.S. Provisional Applications Nos. 61/792,886, filed Mar. 15, 2013 and 61/783,507, filed Mar. 14, 2013, the entire contents of all of which are incorporated herein by reference and for all purposes.

STATEMENT OF FEDERALLY SPONSORED RESEARCH OR DEVELOPMENT

This invention was made with U.S. Government support from the U.S. Army under Contract W31P4Q-09-D-0004. The U.S. Government has certain rights in the invention.

BACKGROUND

These teachings generally relate to optical interconnects and signal routing.

Current signal routing from one circuit board to another within an electronics enclosure typically uses an electrical path through a common backplane and backplane connectors. Routing signals through the backplane is often difficult on densely populated circuit boards and limits layout freedom.

There is a need for a signal routing solution that frees board layout and reduces the number of connections to the backplane and traces run to the backplane.

SUMMARY

Various embodiments of the present teachings disclose optoelectronic modules that reduce the need to route signals through connectors or to the backplane by routing signals optically between boards.

For a better understanding of the present invention, together with other and further objects thereof, reference is made to the accompanying drawings and a detailed description.

BRIEF DESCRIPTION OF THE DRAWINGS

FIG. 13 shows an embodiment of the directly board-mounted module of these teachings.

DETAILED DESCRIPTION OF THE PREFERRED EMBODIMENTS

Figure 1:
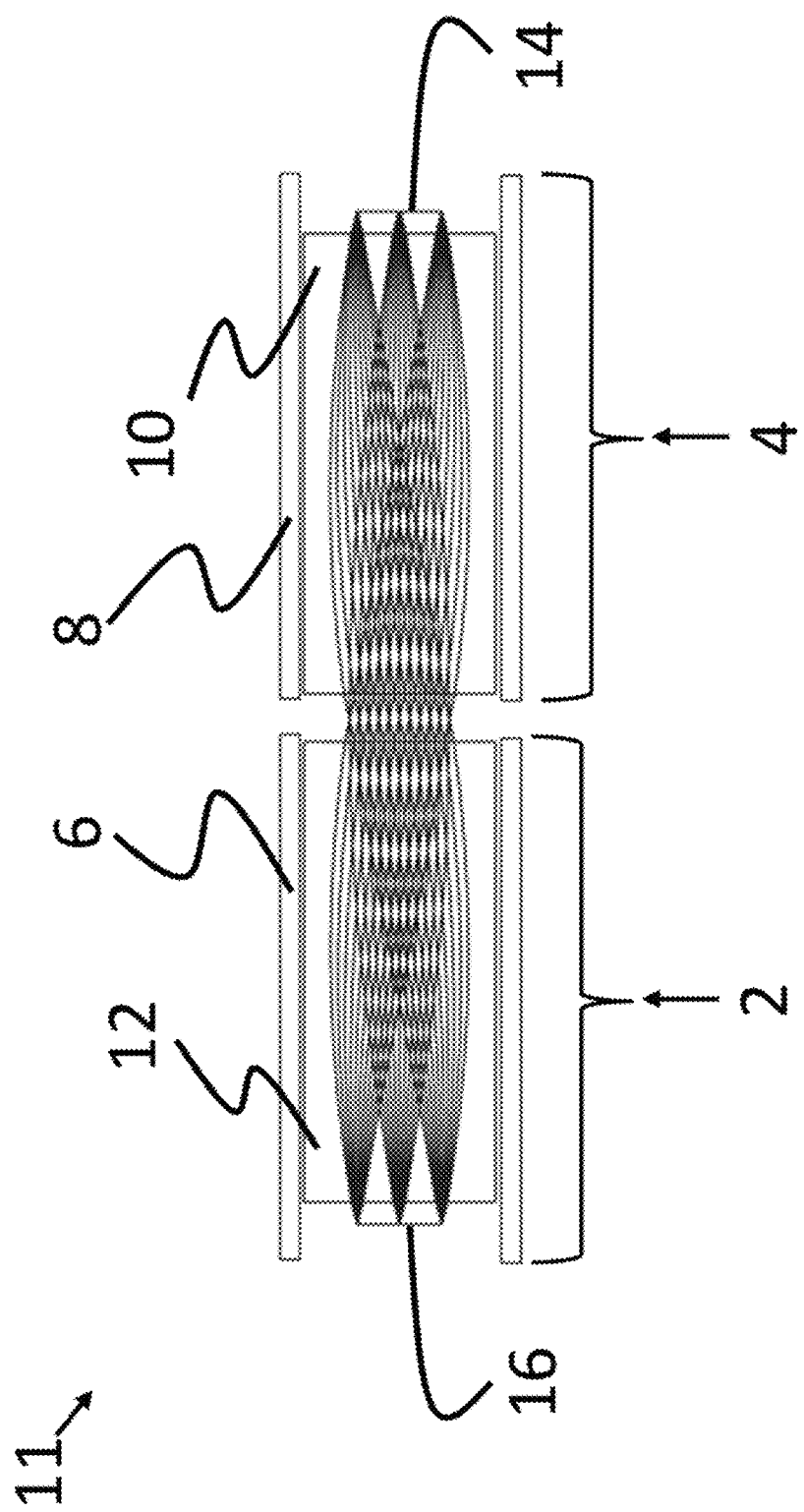
FIG. 1 illustrates a relay lens system as used in these teachings.

Reference is made to FIG. 1, which illustrates an imaging relay lens system 11 including a pair of lenses 10 and 12 used to reimage an object array 16 to an image array 14. See, for example, U.S. Pat. Nos. 6,635,861, 7,015,454, 7,446,298, and 8,171,625, which are incorporated herein by reference in their entirety and for all purposes.

The system 11 in FIG. 1 is designed to substantially tolerate misalignments between a first imager assembly 2 (comprising a housing 6, an imager 12, and an object array 16), and a second imager assembly 4 (comprising a housing 8, an imager 10, and an image array 14), making a connectorless opto-electronic data transmission scheme possible. The first imager assembly 2 and the second imager assembly 4 are each herein referred to as a "module," which refers to an assembly or component that contains, but is not limited to, a housing, an imager, and an image or object array. An array may include optoelectronic components, waveguides, or other sources of electromagnetic radiation, or detectors of electromagnetic radiation. The object array 16 includes a single emitter or an array of emitters, and the image array 14 includes a single detector or an array of detectors. Herein, "emitter" refers to a source of light including, but not limited to, VCSELs, LEDs, optical fibers, and optical waveguides. Herein, a "detector" refers to a target for said light, including, but not limited to, waveguides, photodiodes, optical fibers, and optical to electrical converters. Herein, an "imager" refers to an optical device or element capable of substantially transmitting light emitted by a source, such as but not limited to a refractive lens, a gradient index (GRIN) rod, a reflective optical assembly, a diffractive lens, etc.

In operation, electromagnetic radiation (typically in the ultraviolet, visible, and/or infrared bands, herein referred to generally as light) emitted or reflected by a given object (either real or virtual, herein referred to generally as emitters) located at the object plane (in this embodiment, but not limited to, an object array 16) is incident on a first imager 12, in this embodiment, comprising, but not limited to, a gradient index (GRIN) rod lens, which is capable of substantially receiving a portion of the light emanating from the object array 16 and substantially collimating the light. The light is then incident on a second imager 10, in this embodiment, comprising, but not limited to, a gradient index (GRIN) rod lens, which is capable of substantially receiving the light from the first imager 12 and substantially focusing the light to a image array 14. The first imager 12 and second imager 10 are affixed to housings 6 and 8 respectively.

Figure 2:
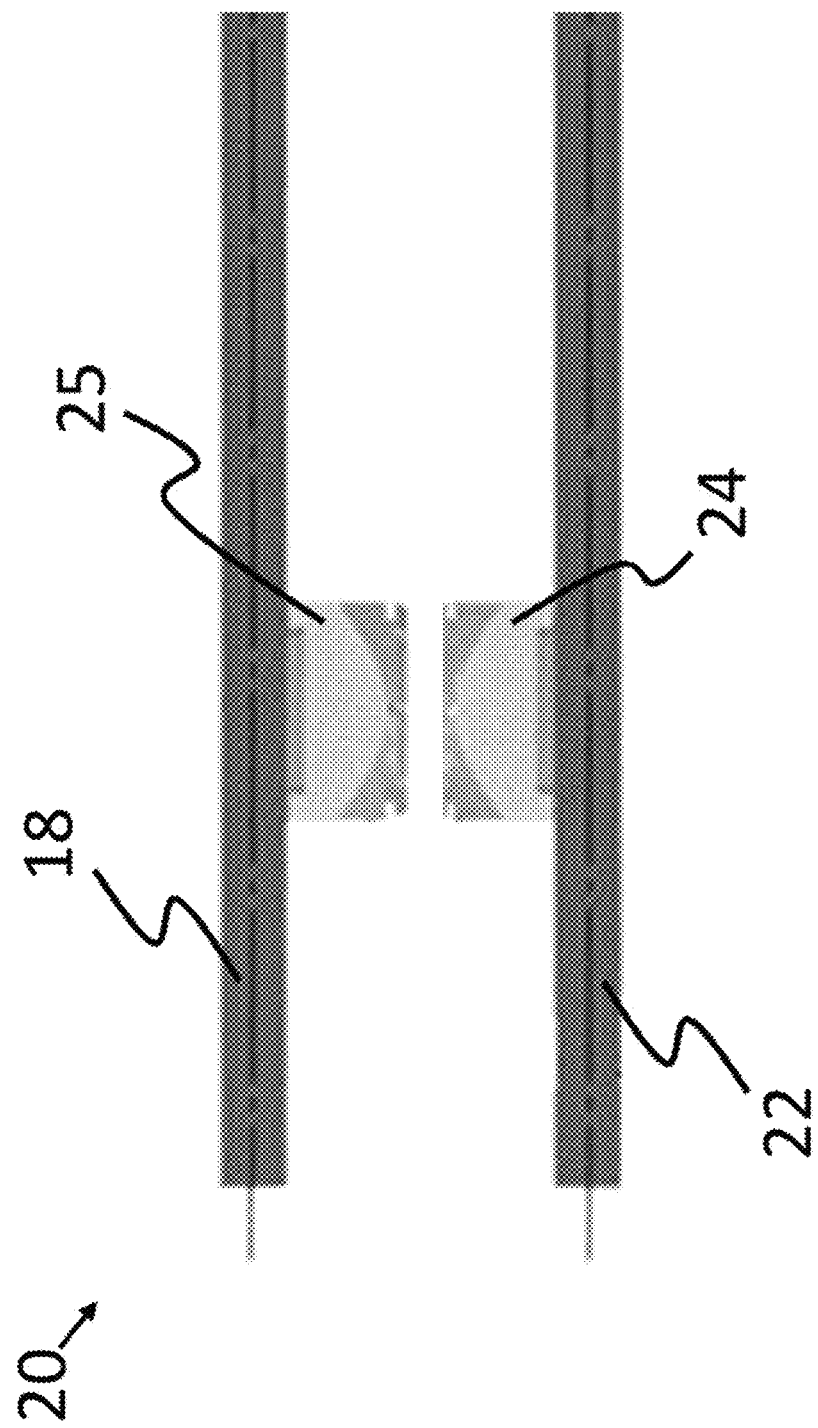
FIG. 2 illustrates an embodiment of the modules of these teachings as mounted on two adjacent boards.

Reference is made to FIG. 2, wherein an embodiment of an optical system 20 is shown, where the first imager assembly 2 and second imager assembly 4 are embodied as modules 24 and 25, acting together in connectorless pairs of Optical Data Pipes (ODPs). ODPs transmit data from a first circuit board 18 to a second circuit board 22 directly without the need to route signals through connectors on a common backplane and without the need for any common electrical or mechanical connection of the circuit boards 18 and 22 provided the ODP modules are oriented and positioned within the acceptable relative misalignment determined by the imager and array designs. In various embodiments, the ODP modules 24 and 25 may be a transmitter module, a receiver module, or a bi-directional transceiver module, depending on design choices. These modules can be electrically connected to the mounts or circuit boards 18 and 22, and operated as discrete opto-electronic devices.

Figure 3:
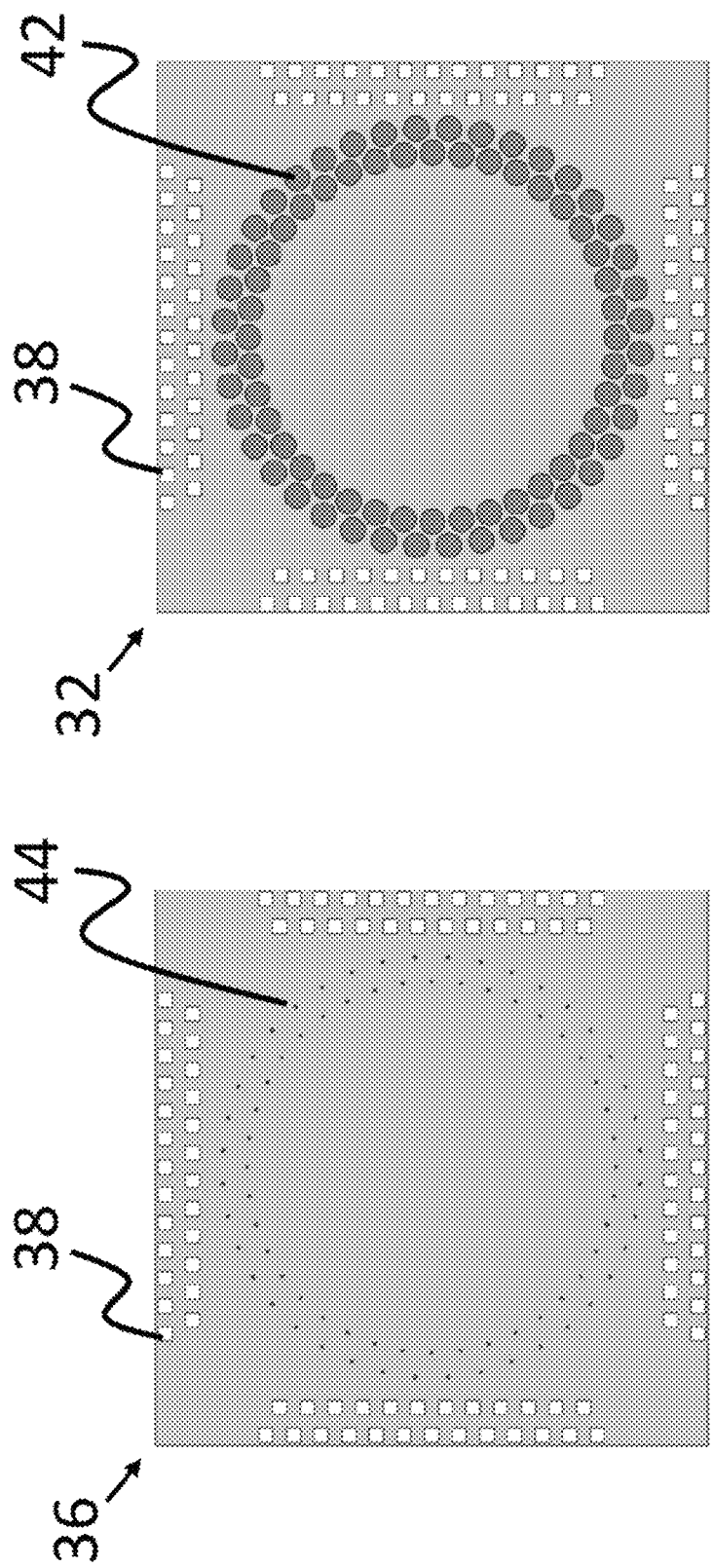
FIG. 3 shows embodiments of (a) an emitter die and (b) a detector die in these teachings.

Reference is made to FIG. 3(*a*) which illustrates an embodiment of the object array 16 as illustrated in FIG. 1, comprising an optoelectronic transmitter die 36 including an array of emitters 44 (shown as an array of small circles) and an array of wirebond pads 38 (shown as an array of small squares). Reference is made to FIG. 3(*b*) which illustrates an embodiment of the image array 14 as illustrated in FIG. 1, comprising an optoelectronic receiving die 32 including an array of detectors 42 (shown as an array of large circles) and an array of wirebond pads 38 (shown as an array of small squares).

Figure 4:
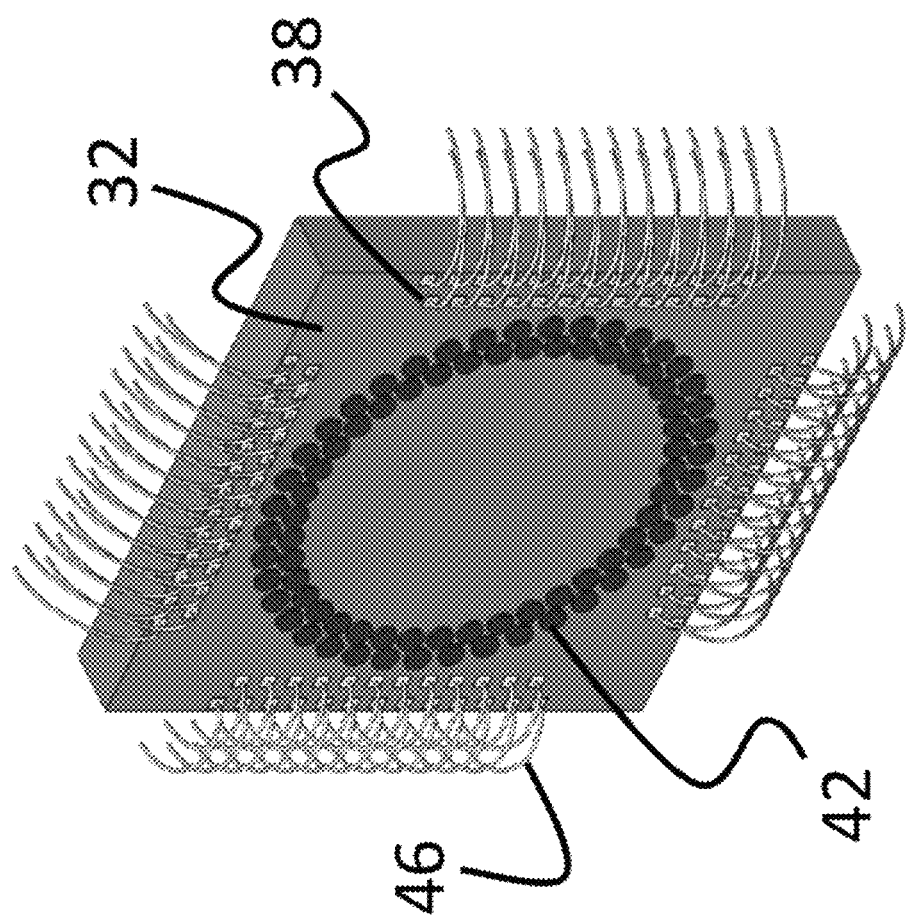
FIG. 4 shows an embodiment of the detector die in these teachings with the wirebonds attached.

Reference is made to FIG. 4, which illustrates the image array 32 illustrated in FIG. 3*b*, where the receiving die 32 is electrically connected with an interposer (not shown) by means of wire bonds 46, connected to the array of wirebond pads 38 on the die 32. The array of wire bond pads 38 are shown merely for exemplary purposes and not for limiting the arrangement. Alternative means are possible to electrically connect the die with the interposer using, for example, flip chip technology.

Figure 5:
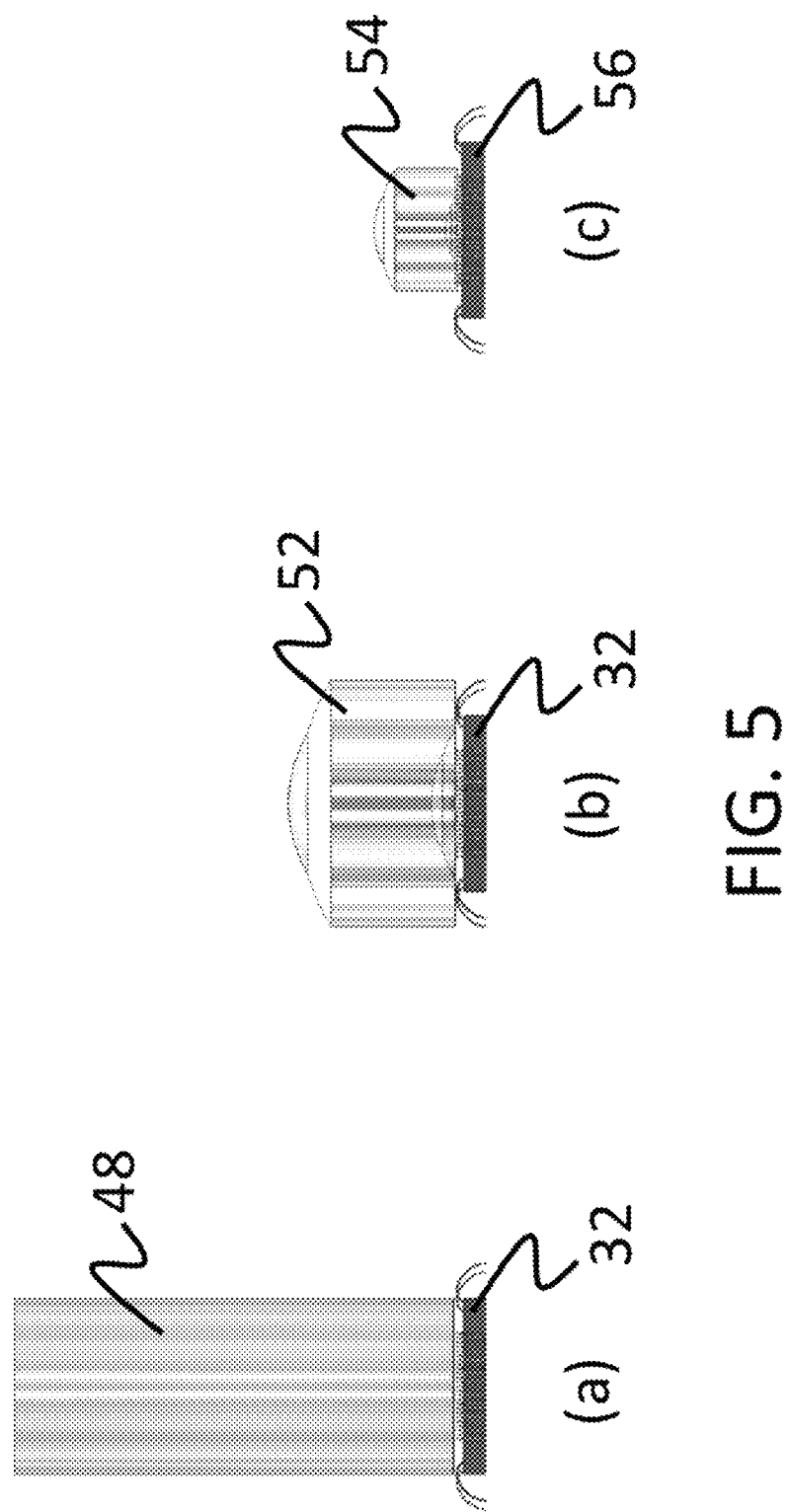
FIG. 5 shows embodiments of various imagers in these teachings.
Figure 6:
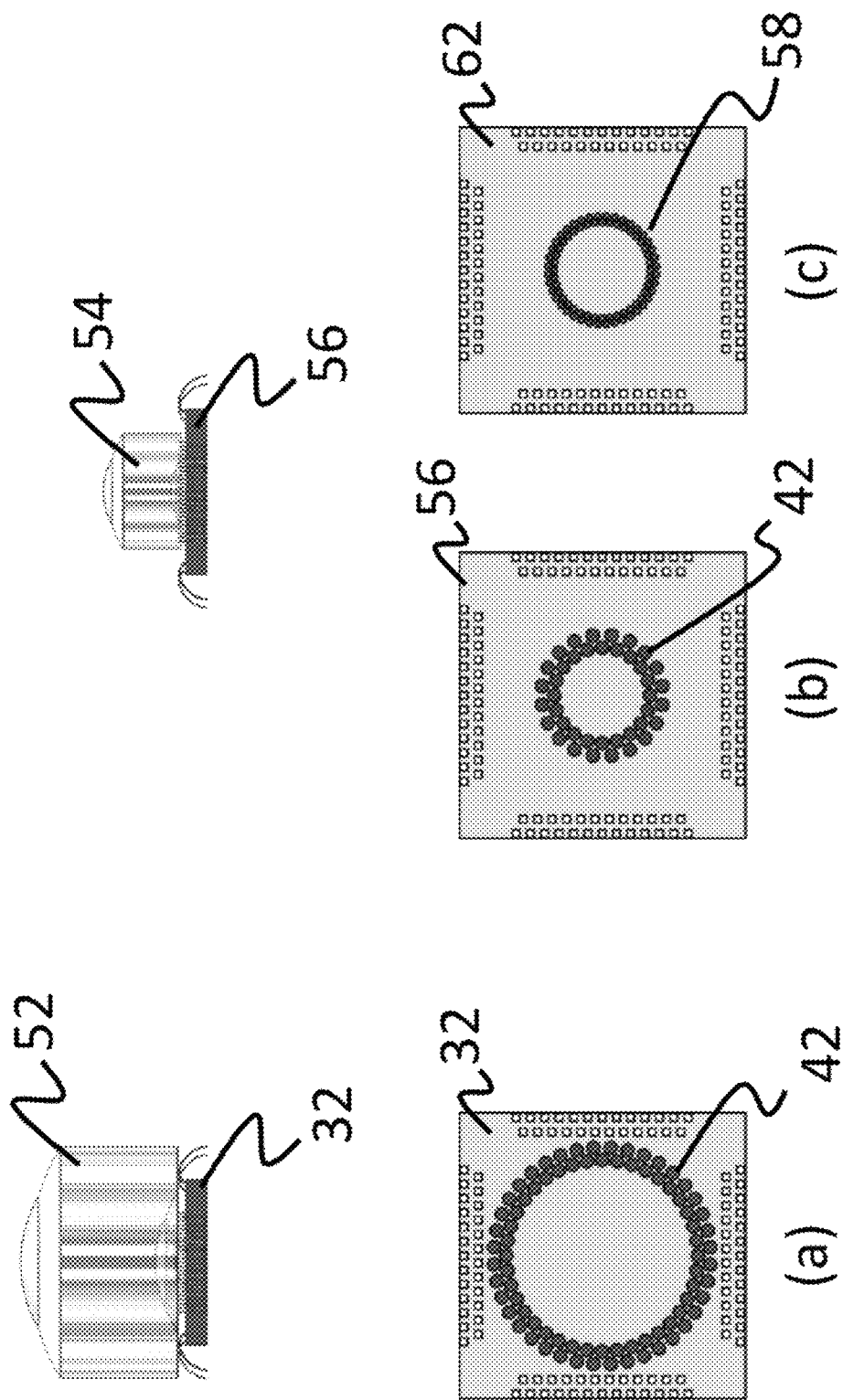
FIG. 6 shows embodiments of detector dies with different variations on detector element size and number in these teachings.

Reference is made to FIG. 5, which illustrates a comparison of relative sizes according to related embodiments. Two embodiments of advanced imagers 52 and 54 are shown alongside a Gradient Index (GRIN) lens 48, where FIG. 5(*a*) illustrates the GRIN lens 48 with a die 32 (the same die as in FIG. 4), FIG. 5(*b*) illustrates a more compact imager 52 with a die 32, and FIG. 5(*c*) illustrates an even smaller imager 54 with a die 56 having an array with a reduced number of emitters or detectors (herein referred to generally as channels). Further details regarding the advanced imager options are illustrated in FIG. 6(*a*), where compact imager 52 is above an array of detectors 42 on die 32 illustrated in FIG. 3*b*. The smaller imager 54 can be used by reducing the number of detectors 42, as shown in FIG. 6(*b*) on the die with fewer channels 56, or by maintaining the number of channels (and detectors) but using reduced-size detectors 58 on die 62 as shown in FIG. 6(*c*).

Figure 7:
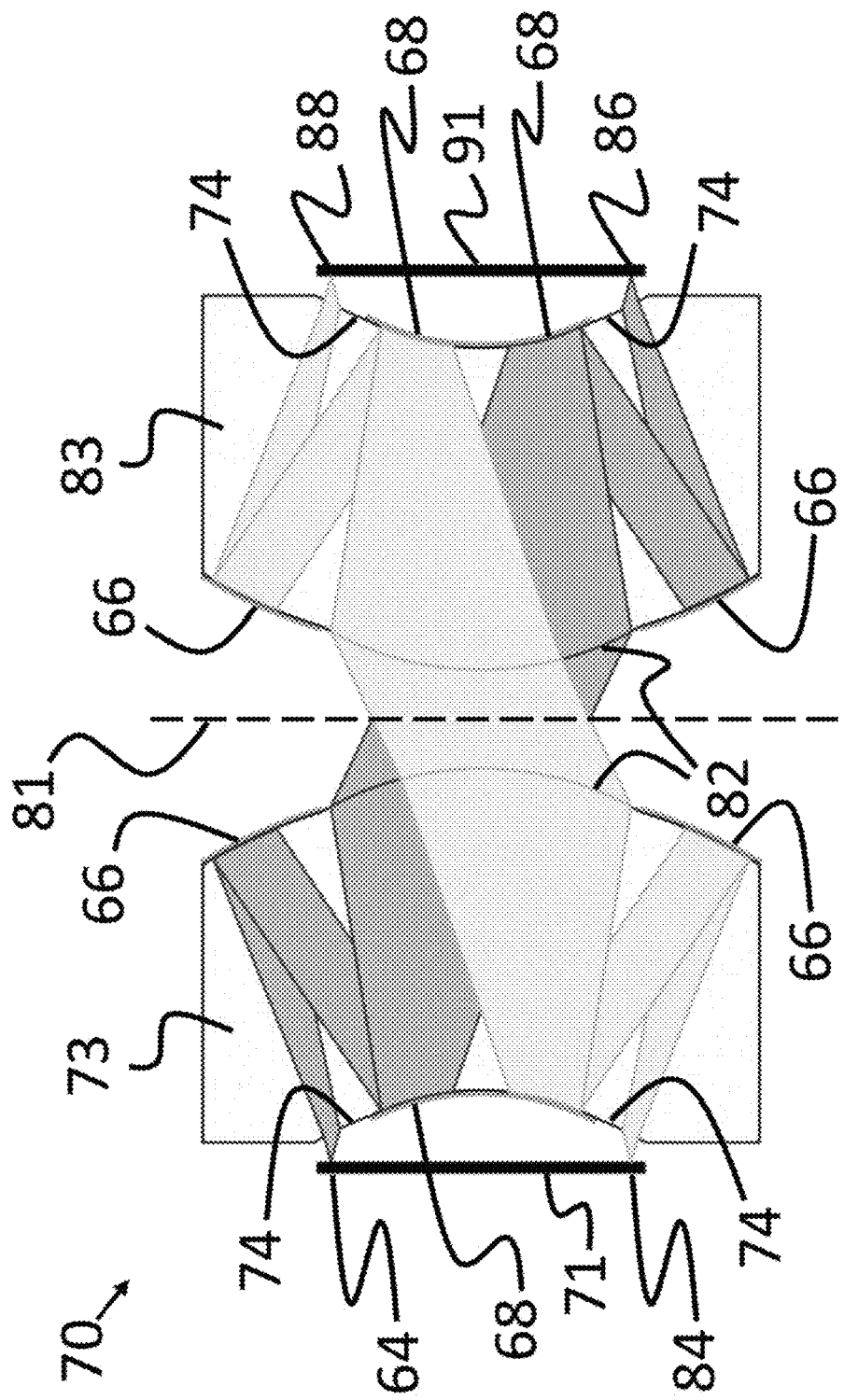
FIG. 7 illustrates an embodiment of the optical system in these teachings.

A schematic view of a compact annular field imaging relay lens 70 is provided in FIG. 7 with an optical ray trace shown for a pair of object elements within the annular field. In operation, light originating from a first source element 64 in an annular source array 71 is incident upon a first half relay lens 73 comprising a catadioptric element where the light is refracted by a first optical surface 74, which is substantially capable of receiving a portion of the light, and substantially transmitted to a first reflective surface 66, which is substantially capable of receiving the light refracted by the first optical surface 74. The light is then reflected by the first reflective surface 66 and transmitted to a second reflective surface 68, which is capable of substantially receiving the light reflected by the first reflective surface 66. The light is then reflected by the second reflective surface 68 and transmitted to a second optical surface 82, which is substantially capable of receiving the light reflected by the second reflective surface 68, where the light is refracted and transmitted towards a second half relay lens 83, which is oriented substantially symmetric to the first half relay lens 73 about the plane 81 separating the two lenses 73 and 83.

The light is then incident upon the second half relay lens 83 comprising a catadioptric element where it is refracted by a first optical surface 82, which is substantially capable of receiving the light, and substantially transmitted to a first reflective surface 68, which is substantially capable of receiving the light refracted by the first optical surface 82. The light is then reflected by the first reflective surface 68 and transmitted to a second reflective surface 66, which is substantially capable of receiving the light reflected by the first reflective surface 68. The light is then reflected by the second reflective surface 66 and transmitted to a second optical surface 74, which is substantially capable of receiving the light reflected by the second reflective surface 66, where it is refracted and imaged to a first detecting element 86 in an annular detecting array 91.

In a similar fashion, a second source element 84 in the annular source array 71 is substantially reimaged by the pair of compact annular field imaging relay lenses 73 and 83 to a second detecting element 88 in the annular detecting array 91, and likewise all source elements in the annular source array 71 are substantially reimaged to respective detecting elements in the annular detecting array 91. In practice, the half relay lenses 73 and 83 can include any combination of refractive, reflective, or catadioptric elements.

Figure 8:
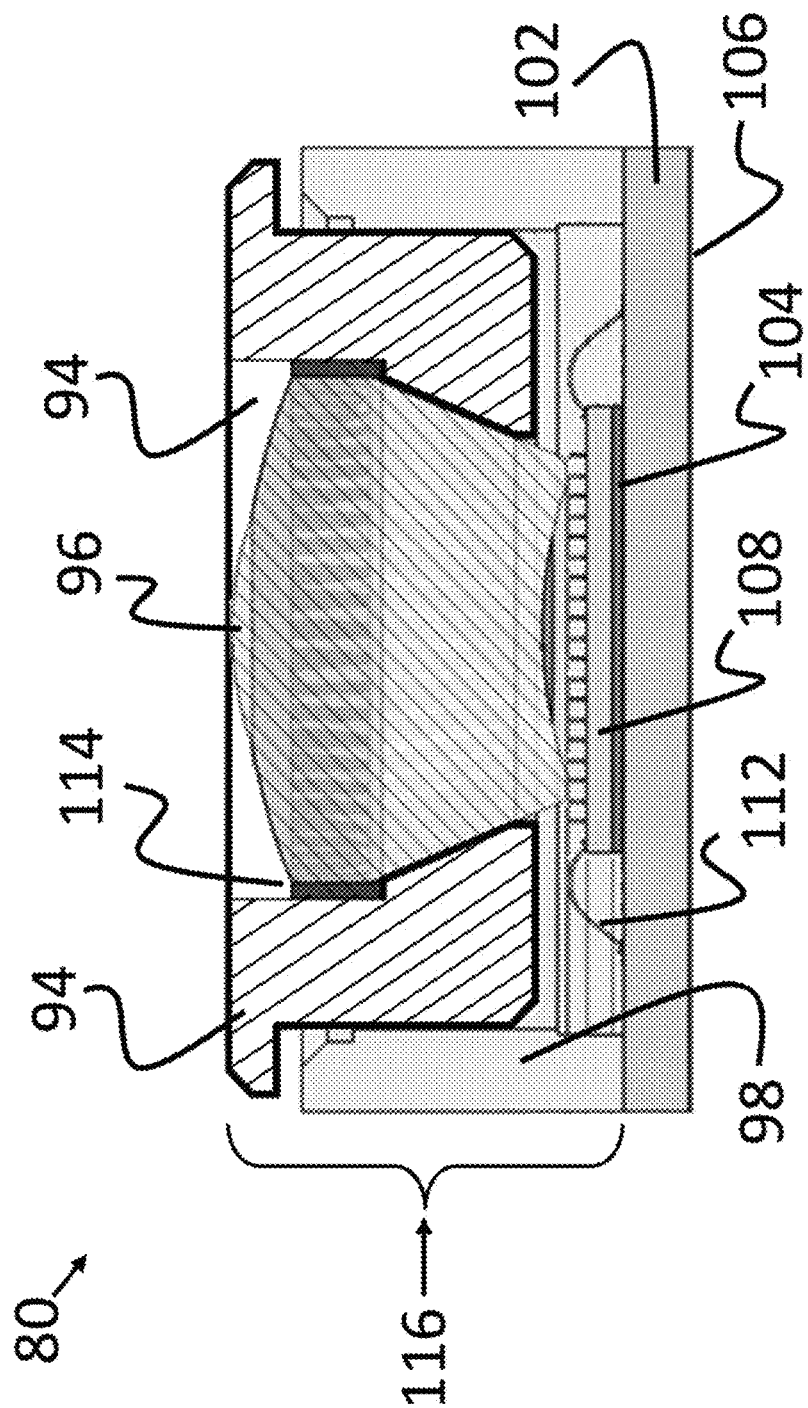
FIG. 8 shows an embodiment of the module in these teachings.

FIG. 8 shows an ODP module 80 in accordance with an embodiment of the present disclosure. As shown in FIG. 8, ODP module 80 includes an imager 96, which is capable of substantially focusing light onto an array of detectors on an optoelectronic die 108, substantially collimating light emitted from an array of emitters on an optoelectronic die 108, or any combination thereof (including bi-directionally focusing and collimating light between arrays including both detectors and emitters); an imager housing 116 (in this embodiment, comprising an imager housing base 98 and an imager housing insert 94) to position, hold and protect the imager 96, and provide protection for the opto-electronic die 108 and wire bonds 112; an optoelectronic die 108 with an array of detectors, emitters, or both; and an interposer 102.

In this embodiment, the interposer 102 is a printed circuit board. It is appreciated that in other instances, interposer 102 may be, for example, a thick film ceramic circuit card, a co-fired ceramic circuit card, or any substrate capable of routing electrical signals. In this embodiment the die 108 is electrically connected by, but not limited to, wire-bonds 112 to the interposer 102 and affixed with epoxy 104. The imager is affixed with epoxy 114 within the imager housing 116 and the imager housing 116 in turn is affixed to the interposer 102. In other embodiments, components affixed to each other with epoxy may be affixed by other means, including, but not limited to, heat staking, molding, crimping, pressing, and welding.

Figure 9:
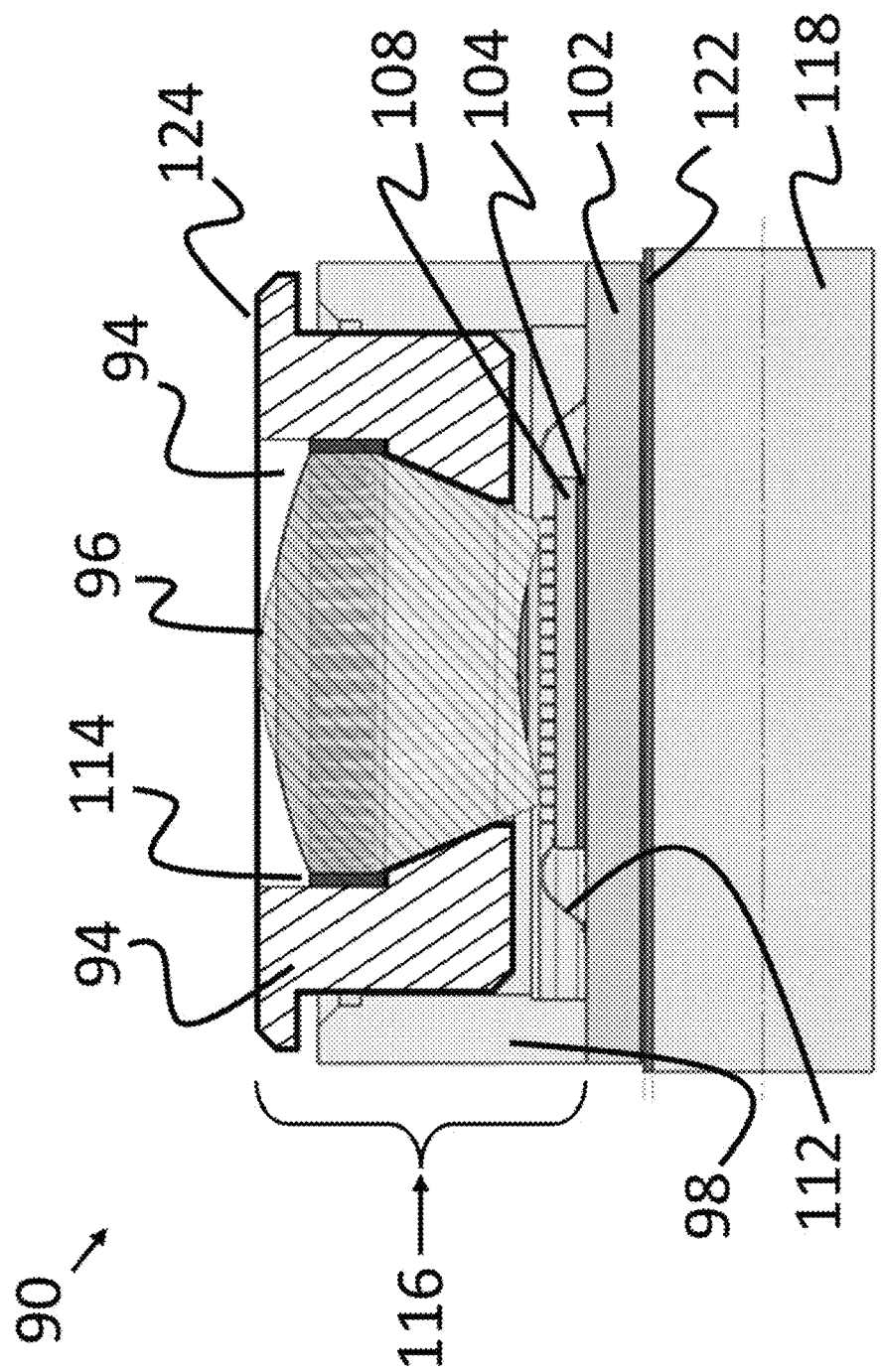
FIG. 9 shows another embodiment of the module in these teachings.

FIG. 9 shows the module 80 of FIG. 8 as being mounted to an application circuit board 118. This particular embodiment 90 has the following features: an imager 96 is recessed from the front surface of the imager housing 124 to prevent damage to the imager 96, should the two opposing ODP modules 90 contact each other because of flexing of the application PCBs or for some other reason; a two-piece housing where the imager housing insert 94 is threaded into the imager housing base 98 to provide a focus adjustment during initial alignment.

In this embodiment 90, the interposer 102 substantially conducts electrical signals between the optoelectronic die 108 and the circuit board 118 on which interposer 102 is mounted via surface mount technology, in this case for example, but not limited to, a Land Grid Array 106 (called out in FIG. 8, but too thin to be seen in this section) or Ball Grid Array. Other surface mount technologies that could be used include, but are not limited to, column grid arrays, micro-ball grid arrays, and Low-profile Quad Flat Package (LQFP). The module 80 can have other means of electrical connection such as but not limited to discrete wires, flexible printed circuits, or pin arrays. The module 80 can also be mounted to substrates other than printed circuit boards, and can be mechanically affixed to the substrate with an epoxy 122 as shown in FIG. 9, or by another means such as, but not limited to, heat staking, welding, or soldering.

Other embodiments include, but are not limited to, the previously listed embodiment 80 with substitutions such as, but not limited to, any or all of the following: a flip-chip die instead of a wire-bonded die 108; a single-piece or multi-piece housing, instead of a two-piece housing 116; and a through-hole pin array, any surface mount technology, or wire-bonds for electrically connecting to the application circuit board or mount instead of using a land grid or ball grid array.

Figure 10:
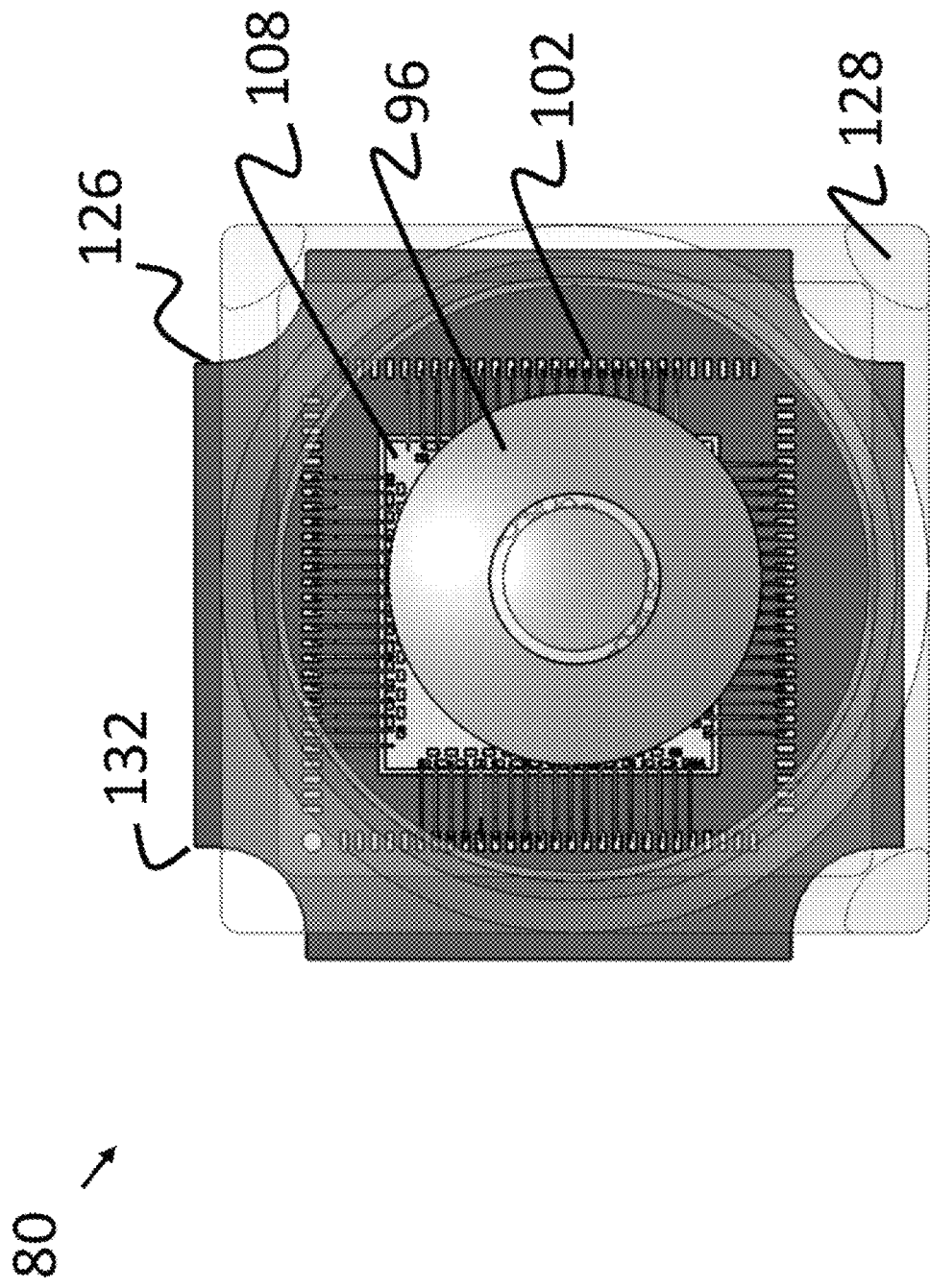
FIG. 10 shows the embodiment of the module illustrated in FIG. 8 with the housing transparent to show a wirebond protection feature of these teachings.
Figure 11:
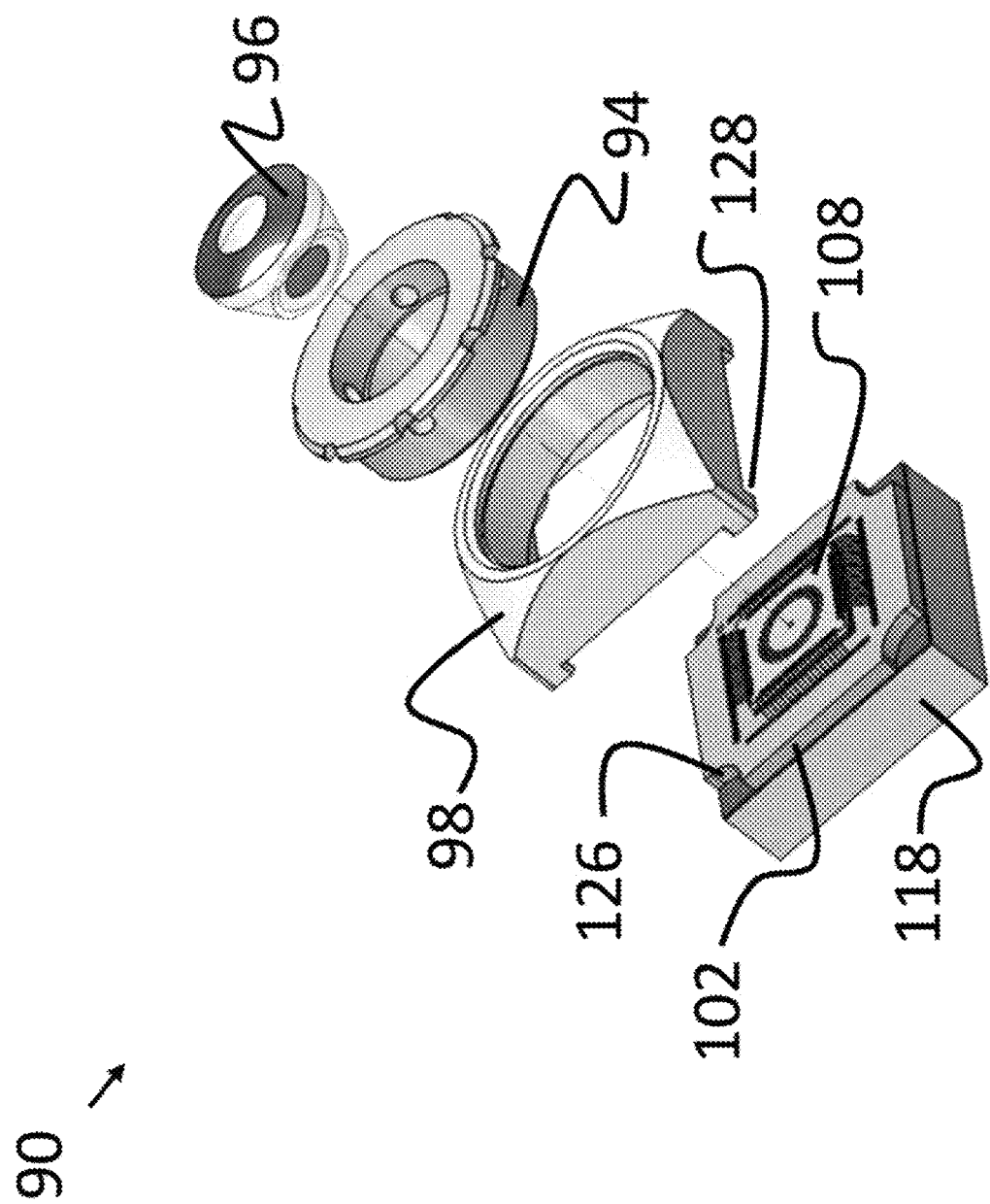
FIG. 11 shows an exploded view of the embodiment of the module of these teachings illustrated in FIG. 8.

Further, as shown in FIG. 10, a partially transparent view of the embodiment 80 shown in FIG. 8, and, as shown in FIG. 11, an exploded view of the embodiment 90 shown in FIG. 9, a means of allowing for in-plane alignment of the imager 96 to the object array or image array (in this embodiment an optoelectronic die 108) can limit travel sufficiently to prevent damage to the wire-bonds during the alignment process. The wirebond protection is embodied in the posts 128 on the imager housing base 98 and oversized notches 126 in the interposer 102 that accept the posts 128. When the posts 128 hit the sides of the notches 126, as illustrated in FIG. 10, the housing 116 has reached the limit of its travel. Yet another embodiment includes an imager/housing assembly that incorporates datum geometry that substantially fixes the imager in the correct location with respect to the emitter/detector array.

Figure 12:
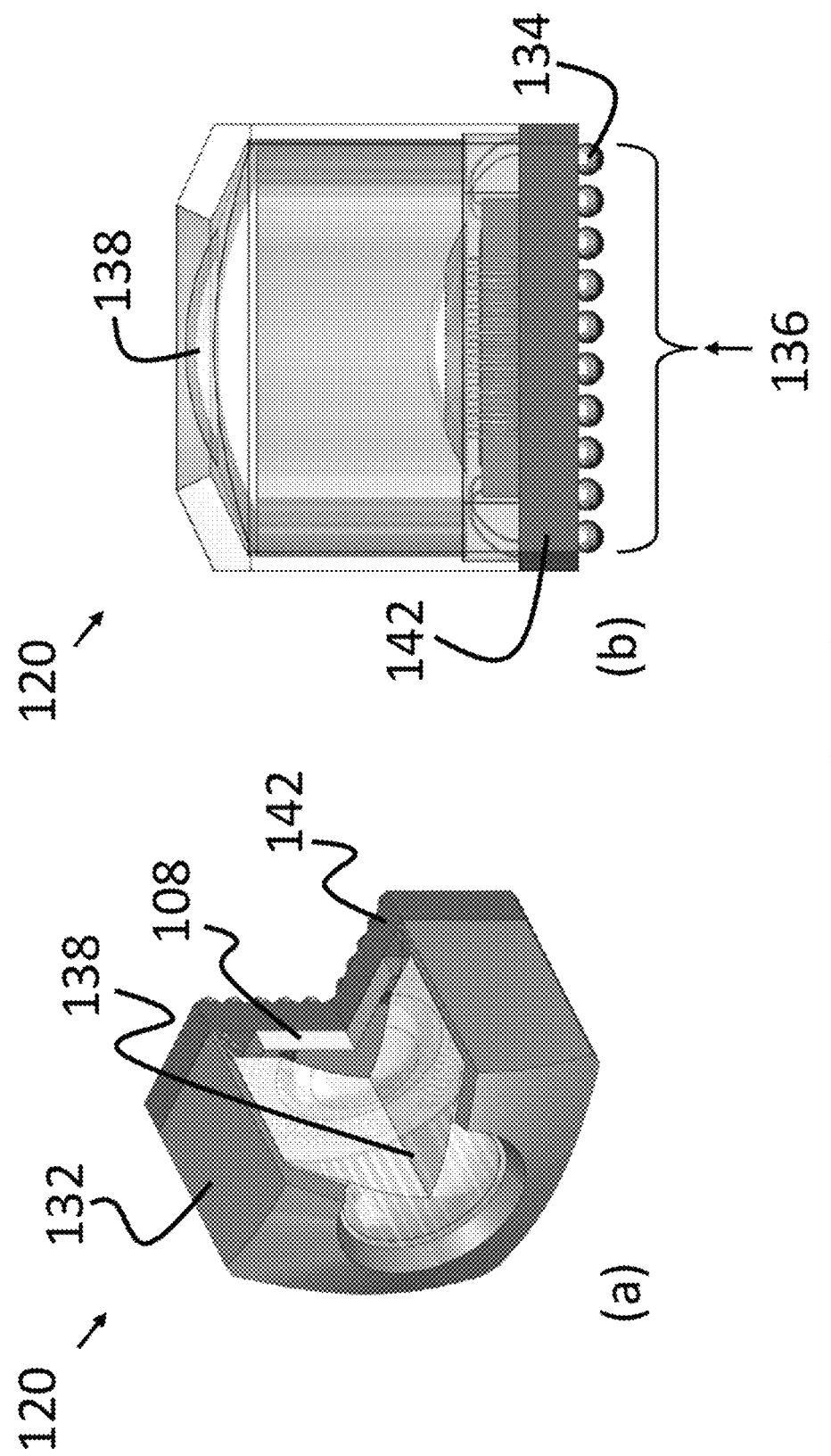
FIG. 12 shows a molded-housing embodiment of the module of these teachings.

FIG. 12 shows an embodiment of a module of these teachings 120 that has an injection-molded housing 132 molded around the imager 138. Once the imager 138 is focused and aligned to the die 108, the housing 132 and interposer 142 can be bonded together.

In another embodiment of a module of these teachings, as shown in FIG. 13, an ODP module 130 includes a die mounted and wire bonded directly to the application circuit board 118, with the interposer being eliminated. The housing 116, in turn, is bonded directly to the application circuit board 118. The bonded assembly of the housing 116 and imager 96 can be actively aligned to the board-mounted die, or placed in a datum geometry that substantially fixes the bonded housing 116 and imager 96 assembly in the correct location with respect to the object array, image array, or any combination thereof.

Note that while housings discussed herein are shown as part of the imager and housing assemblies, the functions performed by the housings (for example, but not limited to, protection, mounting features, and tooling features) can be incorporated into the imagers. Herein, where the term "housing" is used to refer to the component or components containing or holding an imager, it should be taken to also mean those features on an integrated housing-imager, such as, but not limited to, a molded optical element with housing features that serve the same purpose.

Note that herein, "transmitting elements", also known as "transmitters" and "emitters," can refer to any number of devices, such as but not limited to, optical waveguides, optical fibers, and VCSELS. Herein, "receiving elements," also known as "receivers," can refer to any number of devices, such as, but not limited to, optical waveguides, optical fibers, and optoelectronic detectors. The term "optoelectronic detectors" (or simply "detectors") refers to elements that produce an electrical signal in response to incident light.

As used herein, the singular forms "a," "an," and "the" include the plural reference unless the context clearly dictates otherwise. Except where otherwise indicated, all numbers expressing quantities of ingredients, reaction conditions, and so forth used in the specification and claims are to be understood as being modified in all instances by the term "about."

For the purpose of better describing and defining the present invention, it is noted that terms of degree (e.g., "substantially," "about," and the like) may be used in the specification and/or in the claims. Such terms of degree are utilized herein to represent the inherent degree of uncertainty that may be attributed to any quantitative comparison, value, measurement, and/or other representation. The terms of degree may also be utilized herein to represent the degree by which a quantitative representation may vary (e.g., ±10%) from a stated reference without resulting in a change in the basic function of the subject matter at issue.

Although embodiments of the present teachings have been described in detail, it is to be understood that such embodiments are described for exemplary and illustrative purposes only. Various changes and/or modifications may be made by those skilled in the relevant art without departing from the spirit and scope of the present disclosure as defined in the appended claims.

What is claimed is:

1. An optical module comprising:
    a catadioptric imager; said catadioptric imager having an optical axis;
    an array of at least two optical devices comprising at least one optical fiber or waveguide; said array of at least two optical devices being located in an annular region substantially centered about said optical axis;
    an imager housing; said array of at least two optical devices being optically operatively connected to said catadioptric imager;
    the imager housing configured to substantially align the catadioptric imager with said array of at least two optical devices.

2. The optical module of claim 1 wherein said catadioptric imager is configured to substantially focus light onto at least one optical device from said array of at least two optical devices.

3. The optical module of claim 1, wherein said catadioptric imager is configured to substantially collimate light emanating from at least one optical device from said array of at least two optical devices.

4. The optical module of claim 1, wherein said imager housing is affixed to a circuit board.

5. The optical module of claim 1, wherein said catadioptric imager is affixed to an imager housing insert.

6. The optical module of claim 1 wherein the catadioptric imager comprises:

a first optical surface configured to receive light from an object plane, a first reflective surface configured to reflect the light from the first optical surface;

a second reflective surface configured to reflect the light from the first reflective surface; and a second optical surface configured to receive the light from the second reflective surface.

7. A system comprising:

a first optical module comprising:

a first imager; said first imager having a first optical axis;

an array of at least two optoelectronic devices comprising at least one emitter or detector, said array of at least two optoelectronic devices located in an annular array substantially centered about said first optical axis;

a second optical module comprising:

a second imager; said second imager having a second optical axis;

an array of at least two optical devices comprising at least one optical fiber or waveguide; said array of at least two optical devices being located in an annular region substantially centered about said second optical axis;

said first and second optical modules being optically disposed so that said first and second optical modules are optically operatively connected.

8. The system of claim 7 wherein the at least one emitter or detector comprises at least two emitters or detectors; and wherein said at least two emitters or detectors are located in said annular region substantially centered about said first optical axis.

9. The system of claim 7 wherein said at least one optical fiber or waveguide comprises at least two optical fibers or waveguides.

10. The system of claim 7 wherein at least one of said first optical module or said second optical module is affixed to a circuit board.

11. A system comprising:

a first optical module comprising:

a first imager; said first imager having a first optical axis;

said first imager being a catadioptric imager;

a first array of at least two optical devices comprising at least one optical fiber or waveguide;

said first array of at least two optical devices being located in an annular region substantially centered about said first optical axis;

a second optical module comprising:

a second imager; said second imager having a second optical axis;

a second array of at least two optical devices comprising at least one optical fiber or waveguide;

said second array of at least two optical devices being located in an annular region substantially centered about said second optical axis;

said first and said second optical modules being optically disposed so that said first and said second optical modules are optically operatively connected.

12. The system of claim 11 wherein at least one of said first optical module or said second optical module is affixed to a circuit board.

* * * * *